(12) United States Patent
Sasaki et al.

(10) Patent No.: US 6,572,468 B1
(45) Date of Patent: Jun. 3, 2003

(54) CLEAN ROOM DEVICE

(75) Inventors: Tsutomu Sasaki, Chiyoda-ku (JP); Shuichi Kaijo, Chiyoda-ku (JP); Shigeo Yokota, Chiyoda-ku (JP); Matsuo Kamitani, Chiyoda-ku (JP); Takeshi Honma, Chiyoda-ku (JP)

(73) Assignee: Hitachi Plant Engineering & Construction Co., Ltd., Tokyo (JP)

( * ) Notice: Subject to any disclaimer, the term of this patent is extended or adjusted under 35 U.S.C. 154(b) by 0 days.

(21) Appl. No.: 10/031,435

(22) PCT Filed: Jul. 26, 1999

(86) PCT No.: PCT/JP99/03983
§ 371 (c)(1),
(2), (4) Date: Mar. 20, 2002

(87) PCT Pub. No.: WO01/07843
PCT Pub. Date: Feb. 1, 2001

(30) Foreign Application Priority Data

Apr. 21, 1999 (JP) .............................................. 11-113377

(51) Int. Cl.⁷ .................................................. F24F 3/16
(52) U.S. Cl. ...................................... 454/187; 55/385.2
(58) Field of Search ........................ 454/187; 55/385.2, 55/467, 471, 473

(56) References Cited

U.S. PATENT DOCUMENTS 4,693,175 A * 9/1987 Hashimoto .................. 454/187
4,747,341 A * 5/1988 Hedrick ...................... 454/187
4,838,150 A   6/1989 Suzuki et al.
5,858,041 A * 1/1999 Luetkemeyer ............. 55/385.2

FOREIGN PATENT DOCUMENTS

| JP | A 62-134432 |   | 6/1987  |
| JP | U 1-70042   |   | 5/1989  |
| JP | A2-111411   |   | 4/1990  |
| JP | 3-516647    | * | 3/1991  |
| JP | A 9-287791  |   | 11/1997 |
| JP | 11-351627   | * | 12/1999 |

* cited by examiner

Primary Examiner—Harold Joyce
(74) Attorney, Agent, or Firm—Oliff & Berridge, PLC

(57) ABSTRACT

In a ceiling (12) of a room (10) of a clean room device (15), fan filter units (14) are arranged at distances, and to an open grid space where no fan filter unit (14) is provided, a breathable body (40) is provided. When clean air is sent from an over-ceiling space (16) into the room (10) by the fan filter unit (14), an air pressure in the room (10) becomes higher than that in the over-ceiling space (16), and part of the air in the room (10) flows to the over-ceiling space (16) through the breathable body (40). Consequently, it is possible to prevent an occurrence of a swirling current in an area under an open grid space in the room (10), and cleanliness in the room (10) can be raised.

8 Claims, 8 Drawing Sheets

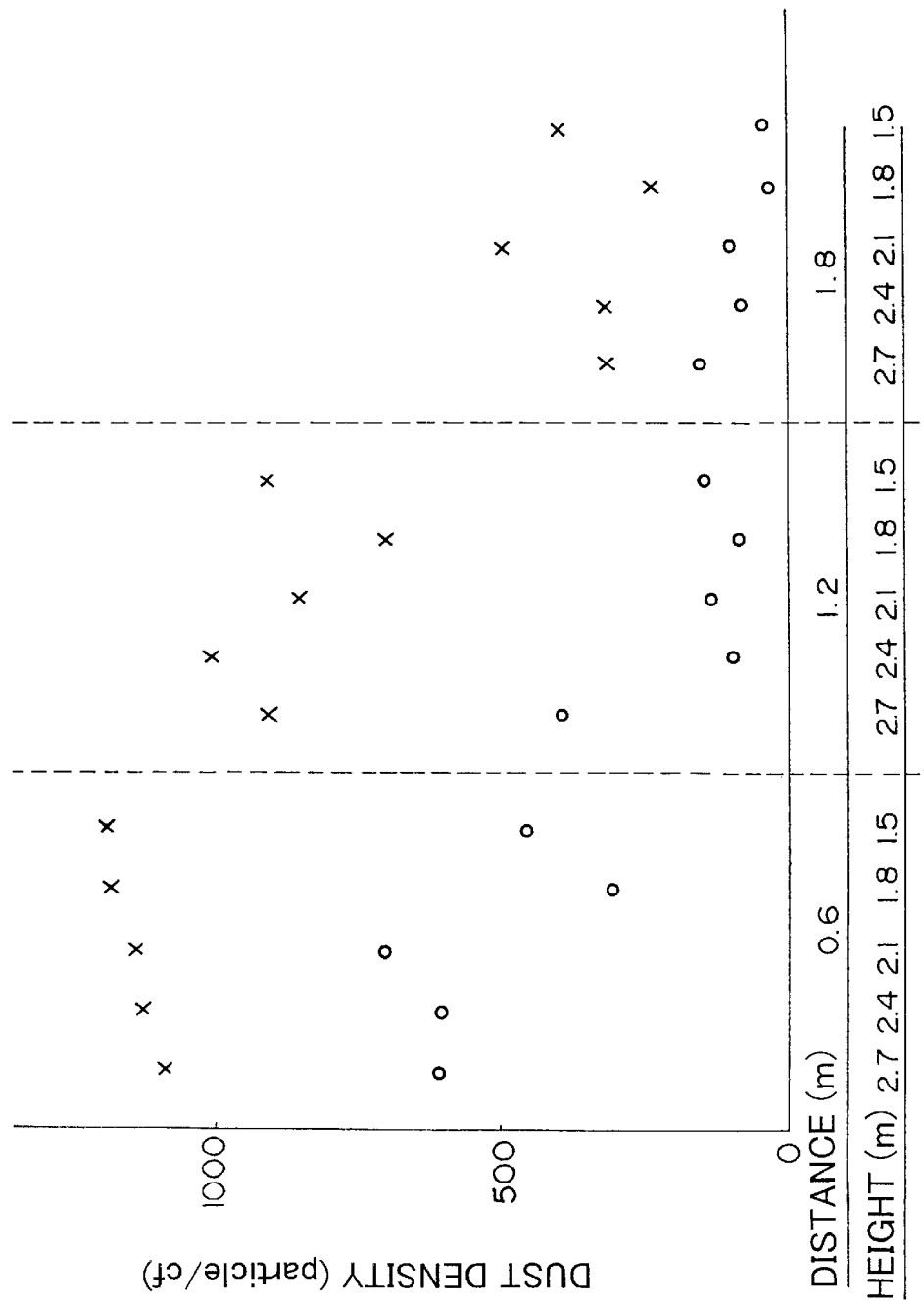

CLEAN ROOM DEVICE

FIELD OF THE INVENTION

The present invention relates to a clean room device, and more particularly, relates to a clean room device of a semiconductor manufacturing plant or the like where a high cleanliness is necessary.

BACKGROUND OF THE INVENTION

At a ceiling of a room of a clean room device of a semiconductor manufacturing plant or the like, ceiling frames are arranged like a grid, and to each grid space formed by these ceiling frames, a fan filter unit is provided. The fan filter unit sends the air in the space over the ceiling (hereafter, referred to as the over-ceiling space) of the room into the room while removing the dust with the filter, by driving the fan. The sent-in clean air flows downward, and flows to the space under the floor (hereafter, referred to as the under floor space) through the grating floor at the under surface of the room together with the dust in the room, and part of that is introduced into the over-ceiling space through the circulating passage, and the residual air is exhausted to the outside of the clean room device. The air introduced into the over-ceiling space is sent in the room while the dust is removed again with the above-described fan filter unit. The air in the room is thus kept clean.

The fan filter units are not always provided to all grating spaces, but in some cases, they are arranged at certain distances for the reduction of the installation cost or the running cost. In those cases, at each grid space where no fan filter unit is provided (hereafter, referred to as the open grid space), a closing plate which completely shuts off the over-ceiling space and the interior of the room has conventionally been provided for preventing the air before the purification in the over-ceiling space from flowing into the room.

However, if the fan filter units are arranged at distances and the closing plate is provided at the open grid space conventionally, there has been such a weak point that the cleanliness in the room can not be raised when compared with the case where the fan filter units are provided at all grid spaces.

SUMMARY OF THE INVENTION

The present invention is achieved due to such a situation, and it is an object to provide a clean room device in which the cleanliness in the room can be raised even if the fan filter units are arranged at large distances.

Conventionally, generally it has been considered that the cleanliness in the room of the clean room device depends on the air volume of the clean air sent into the room, that is, it is necessary to increase the air volume of the clean air for improving the cleanliness in the room. Accordingly, it has been considered that the reason why the cleanliness in the room cannot be raised if the fan filter units are arranged at large distances depends on the reduction of the air volume of the clean air.

However, by following the reason why the cleanliness in the room falls when the fan filter units are arranged at distances, it has become clear that the reason is not the reduction of the air volume of the clean air, but the occurrence of the swirling current at the area under the closing plate provided at the open grid space where no fan filter unit is provided, which causes the dust to stay in the room at that area.

The present invention is achieved by giving attention to this point, and it attains the improvement of the cleanliness in the room where the fan filter units are arranged at distances, by preventing the occurrence of the swirling current in the room.

In order to attain the above-described object, the clean room device of the present invention includes: a room with a ceiling; a fan filter unit which is provided at the above-described ceiling to send clean air into the above-described room from the over-ceiling space; and a breathable body which is provided at the above-described ceiling, characterized in that part of the air in the above-described room flows into the above-described over-ceiling space through the above-described breathable body, by the difference between the air pressure in the above-described room and the air pressure in the above-described over-ceiling space.

According to the present invention, in the ceiling of the room, at the open grid space where no fan filter unit is provided, a breathable body is provided, and by the difference between the air pressure in the room and the air pressure in the over-ceiling space, part of the air in the room is made to flow into the over-ceiling space through the breathable body. Consequently, it is possible to prevent the occurrence of the swirling current at the area under the open grid space, and the cleanliness in the room can be raised.

It is also possible to use a filter for the dust collection as the breathable body. Consequently, it is possible to collect the dust in the air passing through the breathable body by the filter, so that the load of the filter in the fan filter unit is reduced, and in the meantime, it is possible to prevent the dust in the over-ceiling space from entering the room.

Furthermore, it is also possible to provide the fan over the breathable body with a filter. By operating the fan and sending the air from the over-ceiling space through the filter of the breathable body into the room, it is possible to make the filter of the breathable body perform the action of the filter of the fan filter unit, and therefore, it is especially advantageous in the case where a high cleanliness is required at the area under the open grid space. Furthermore, by reversely operating the fan and sucking part of the air in the room through the filter of the breathable body into the over-ceiling space, the air volume of the air flowing to the over-ceiling space from the room can easily be controlled. Furthermore, in the case where the air pressure in the room is higher than the air pressure in the over-ceiling space, part of the air in the room can be made to flow to the over-ceiling space, even if the fan is stopped.

It is also possible to use a perforated plate as the breathable body. By preparing a plurality of perforated plates with different opening ratios, that is, with different breathabilities and properly selecting a suitable plate among them to be provided, or by using a perforated plate whose opening ratio is adjustable, the air volume of the air flowing from the interior of the room through the breathable body into the over-ceiling space can easily be controlled.

Furthermore, the breathable body may be constructed by a filter and a perforated plate. Consequently, the dust in the air passing through the breathable body is collected by the filter, so that the load of the filter in the fan filter unit is reduced, and in the meantime, it is possible to prevent the dust in the over-ceiling space from entering the room. Moreover, by controlling the breathability of the breathable body by using the perforated plate, it is possible to easily control the air volume of the air flowing from the room through the breathable body into the over-ceiling space.

The breathable body preferably has such a breathability that when the air pressure in the room is higher than the air pressure in the over-ceiling space by 0.2 mmAq to 1.5 mmAq, the total air volume of the air flowing into the over-ceiling space through the breathable body from the room becomes 5% to 15% of the total air volume of the air to be sent into the room from the over-ceiling space by the fan filter unit. Consequently, it is possible to effectively prevent the occurrence of the swirling current in the room while keeping the cleanliness in the room.

BRIEF DESCRIPTION OF THE DRAWINGS

FIG. 8 is a drawing showing a dust density in the room of the clean room device of the example of the present invention.

THE PREFERRED EMBODIMENTS OF THE PRESENT INVENTION

Preferable embodiments of a clean room device according to the present invention will be described below according to the attached drawings.

Figure 1:
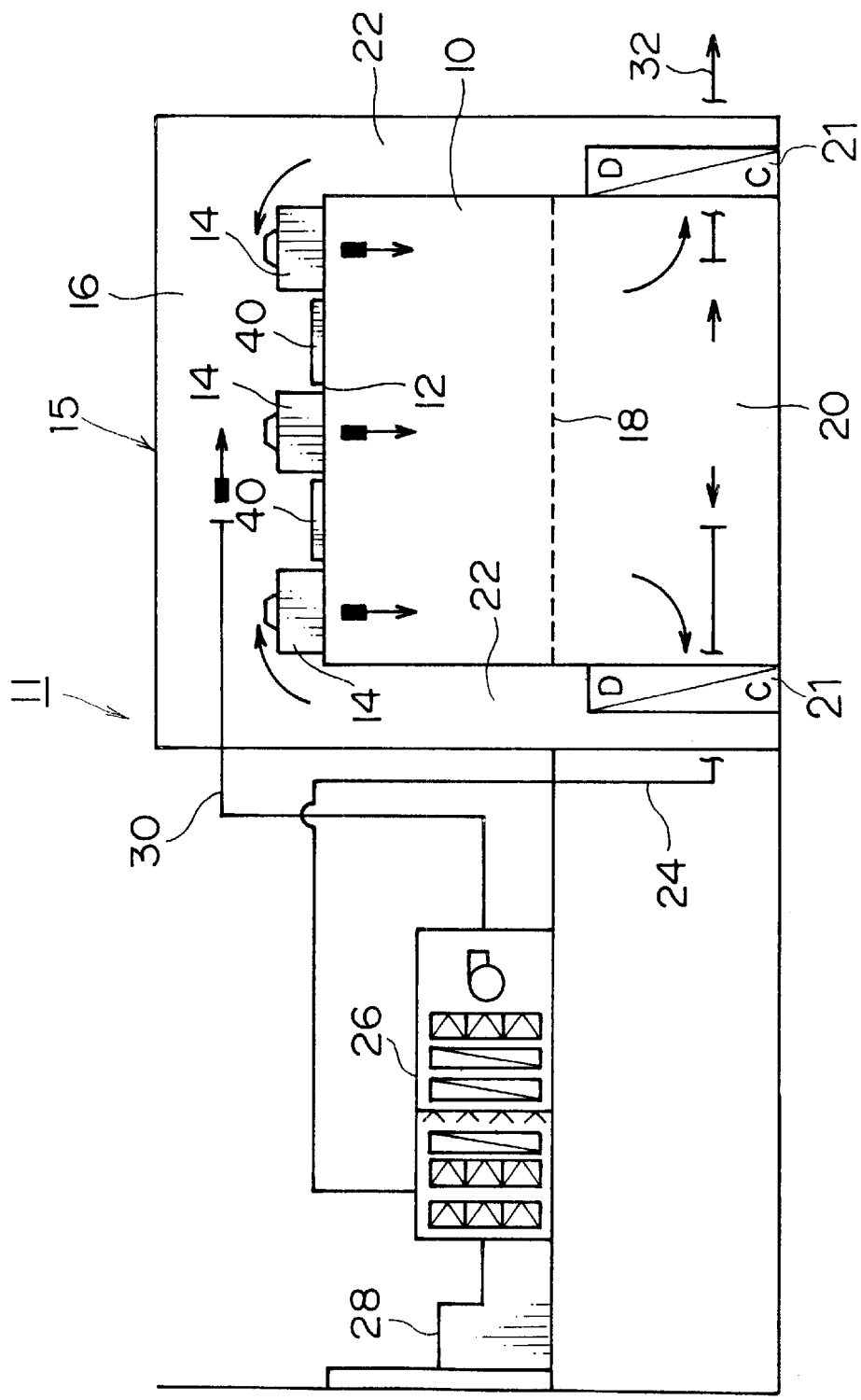
FIG. 1 is a total construction plan view showing a clean room system using a clean room device of the present invention.

FIG. 1 is a total construction plan view showing a clean room system 11 using a clean room device 15 of a first embodiment of the present invention. As shown in the above-described drawing, at a ceiling 12 of a room 10 of the clean room device 15, a plurality of fan filter units 14 are provided. The air in an over-ceiling space 16 of the clean room device 15 is sent into the room 10 while being purified by the fan filter unit 14. The air sent into the room 10 flows into an under floor space 20 through a grating floor 18 together with the dust in the room 10, and is cooled and dried by a drying and cooling coil 21, and after that, it returns to the over-ceiling space 16 through a return space 22. Part of the air in the under floor space 20 of the clean room device 15 is sent to an air conditioner 26 through a circulating duct 24, and is mixed with the fresh air from a fresh air intake duct 28 by the air conditioner 26 to be controlled to have the specified temperature and humidity, and after that, it is sent to the over-ceiling space 16 through an intake duct 30. The air sent to the over-ceiling space 16 like this is sent into the room 10 while being purified again by the fan filter unit 14. Another part of the air in the under floor space 20 is exhausted to the outside of the clean room system 11 through an exhaust duct 32.

Figure 2:
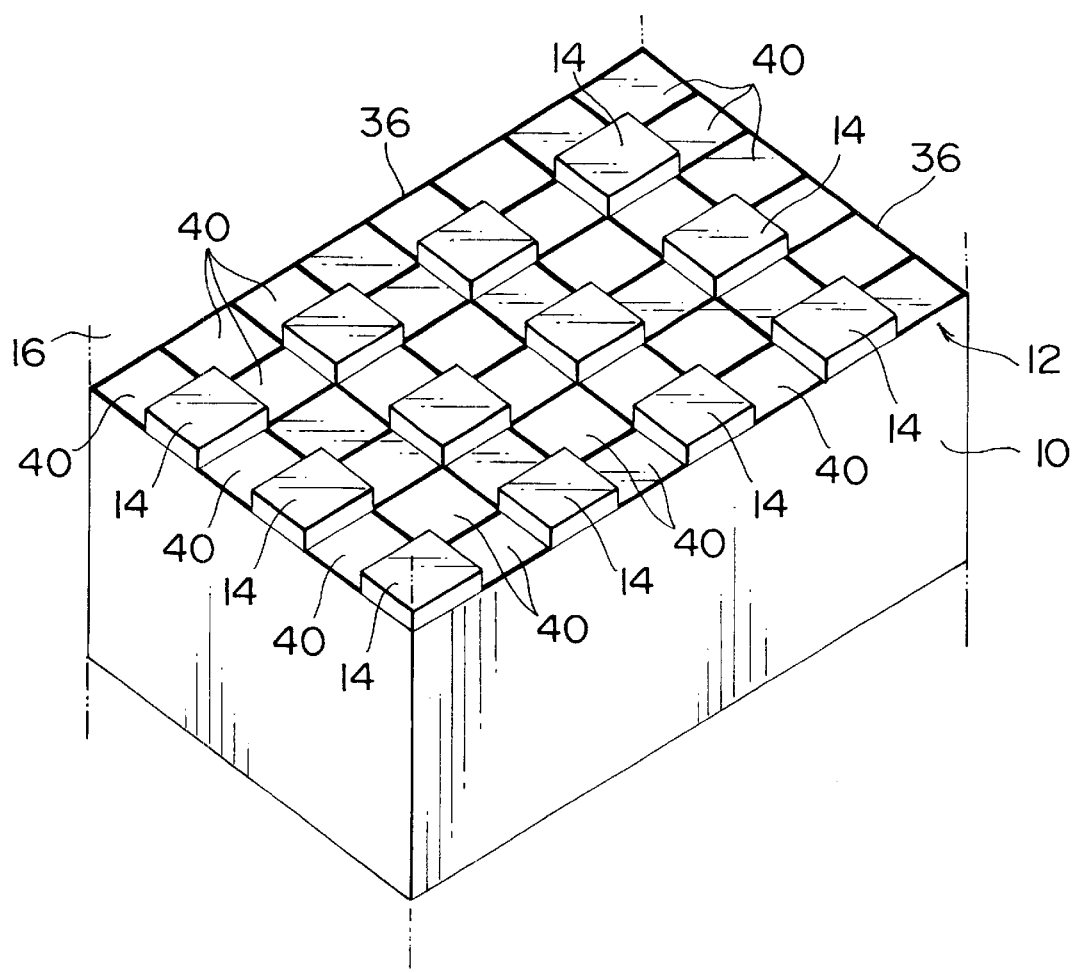
FIG. 2 is a perspective view showing a ceiling of a room of the clean room device in FIG. 1.

FIG. 2 is a perspective view showing the ceiling 12 of the room 10 of the clean room device 15. At the ceiling 12 of the room 10, ceiling frames 36 are provided like a grid. In the grid space formed by the ceiling frames 36, a plurality of fan filter units 14 are arranged at distances. The fan filter unit 14 has a casing, a fan, and a filter, and is constructed such that it sucks the air from the over-ceiling space 16 into the casing by driving the fan, and sends that air into the room 10 while removing the dust with the dust collecting filter attached to the under surface of the casing.

Figure 3:
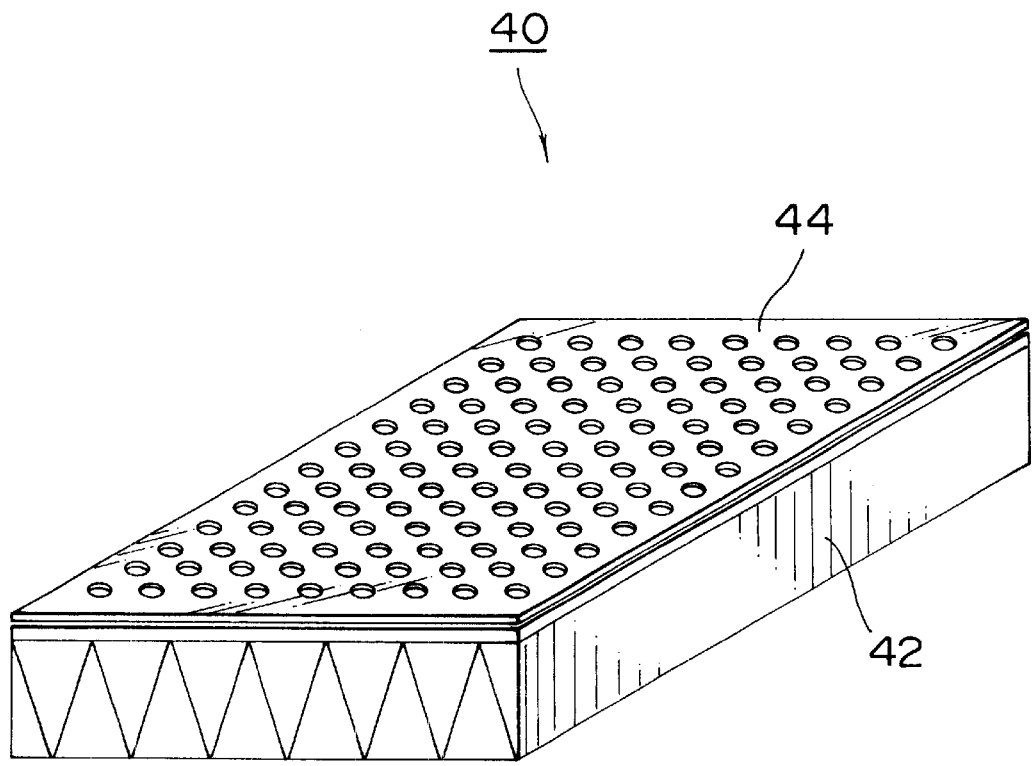
FIG. 3 is a perspective view showing a breathable body in FIG. 1.

Among the grid spaces formed by the ceiling frames 36, in the open grid space where no fan filter unit 14 is provided, a breathable body 40 is provided. The breathable body 40 comprises a filter 42 and a perforated plate 44 as shown in FIG. 3. The filter 42 is a filter made by, for example, folding a nonwoven fabric made of a fiber-like material (such as a glass fiber) like an accordion. When the air including the dust is passed through the filter 42, the dust is collected by the fiber in the interior of the filter 42, and the air is purified.

The perforated plate 44 is a plate where holes are uniformly formed in the plate through the whole surface thereof, and the opening ratio of the perforated plate 44 is determined by considering a breathability of the breathable body 40. For example, it is preferable from the following reason that the breathable body 40 has such a breathability that a total air volume of the air flowing from an inside of the room 10 through the breathable body 40 into the over-ceiling space 16 becomes 5% to 15% of the total air volume of the air sent from the over-ceiling space 16 into the room 10 by the fan filter unit 14 when the air pressure in the room 10 is higher than the air pressure in the over-ceiling space 16 by 0.2 mmAq to 1.5 mmAq. That is, in the case where the breathability of the breathable body 40 is too small and the air volume of the air flowing from the interior of the room 10 through the breathable body 40 to the over-ceiling space 16 is too little, a swirling current is caused under the breathable body 40, and therefore, the dust remains in the room 10. On the contrary, in the case where the breathability of the breathable body 40 is too large and the air volume of the air flowing from the interior of the room 10 through the breathable body 40 to the over-ceiling space 16 is too much, the clean air sent into the room 10 by the fan filter unit 14 flows to the over-ceiling space 16 as it is, and therefore, the efficiency of purification in the room 10 becomes worse. The breathable body 40 may be anyone if it has a necessary breathability. For example, it is also possible to provide only a filter whose breathability is controlled by selecting the kind or the thickness as the breathable body 40. Or, it is also possible to provide only a perforated plate whose opening ratio is controlled so that a proper breathability can be obtained, as the breathable body 40.

The control of the opening ratio of the perforated plate 44 can be performed, for example, by such a method where the perforated plate 44 is made of two perforated plates one of which can slide, to control the overlapping condition of the fellow holes of both perforated plates. By doing this, the opening ratio of the perforated plate 44 can easily be controlled so that the breathability of the breathable body 40 becomes suitable for the scale or the cleanliness of the clean room device 15. Moreover, the opening ratio of the perforated plate 44 can also easily be changed after the completion of the clean room device 15.

The breathable body 40 is not only limited to the above-described perforated plate 44 or filter 42. If it has a proper breathability, for example, a slit plate or a fan filter unit 14 whose operation is stopped can also be used as the breathable body 40.

The action of the clean room device 15 of the first embodiment of the present invention which has the above-described construction will be described.

The fan of the fan filter unit 14 is driven to send the clean air into the room 10. Thereby, under the fan filter unit 14, a downward current is caused toward the grating floor 18 from the ceiling 12, and most of the air in the room 10 flows into the under floor space 20 through the grating floor 18 together with the dust. The air flowing in the under floor space 20 returns to the over-ceiling space 16 except for part of the air to be exhausted to the outside of the clean room system 11, as mentioned above, and it is sent into the room 10 while being purified again by the fan filter unit 14.

By sending the air from the over-ceiling space 16 into the room 10, the air pressure in the room 10 becomes higher than the air pressure in the over-ceiling space 16. Thereby, at the area right under the breathable body 40 in the room 10, an upward current is caused, and part of the air in the room 10 flows into the over-ceiling space 16 through the breathable body 40. Accordingly, it does not occur for a swirling current to be caused in the area under the open grid space like the prior art, and it does not occur for the dust to stay in the room 10.

Thus, in the case of the clean room device 15 of the first embodiment, a breathable body 40 comprising a filter 42 and a perforated plate 44 is provided in the open grid space where no fan filter unit 14 is provided, and therefore, by the difference between the air pressure in the room 10 and the air pressure in the over-ceiling space 16, part of the air in the room 10 is made to flow into the over-ceiling space 16 through the breathable body 40. Thereby, the dust does not stay in the room 10 and is removed, and therefore, it is possible for the interior of the room 10 to have a high cleanliness.

When part of the air in the room 10 flows into the over-ceiling space 16 through the breathable body 40, the dust in that air is collected by the filter 42 of the breathable body 40. Thereby, the volume of the dust to be collected by the filter in the fan filter unit 14 is reduced, and therefore, the life of the filter in the fan filter unit 14 can be extended.

It is also possible that a fan is provided over the breathable body 40 and that fan is driven to send the air in the over-ceiling space 16 into the room 10. Consequently, it is possible to make the filter 42 perform the same action as the filter of the fan filter unit 14, and it is possible to deal with the case where a high cleanliness is required in the area under the breathable body 40.

In the case of the above-described first embodiment, a breathable body 40 is provided in the open grid space where no fan filter unit 14 is provided, among the grid spaces of the ceiling frame 12, but the present invention is not limited to this. For example, it is also possible to provide a breathable body 40 in the space facing to the sidewall or the pillar in the ceiling 12.

In the case of the above-described first embodiment, the air in the room 10 is made to flow into the over-ceiling space 16 by using the air pressure difference caused between the interior of room 10 and the over-ceiling space 16 because of the fan filter unit 14, but the present invention is not limited to this. For example, it is also possible that a fan is provided over the breathable body 40 and the fan is driven to suck the air in the room 10 into the over-ceiling space 16. Thereby, even if the opening ratio of the perforated plate 44 is not controlled, the air volume of the air flowing from the room 10 into the over-ceiling space 16 can easily be controlled by controlling the driving of the fan. Accordingly, an effect similar to that of the above-described embodiment can also be obtained, by such a method where fans of part of the fan filter units 14 among the plurality of fan filter units 14 arranged in the ceiling 12 are reversely driven to suck the air in the room 10 into the over-ceiling space 16. The clean room device 15 in that case will be described below as a second embodiment.

In the case of the clean room device 15 of the second embodiment of the present invention, the fan filter unit 14 is provided to all grid spaces of the ceiling frames 36 in the ceiling 12 shown in FIG. 2. In the case of this fan filter unit 14, the operation can be switched between the blow-out operation where the clean air is sent from the over-ceiling space 16 into the room 10 by normally operating the fan, and the suck-in operation where the air in the room 10 is sucked into the over-ceiling space 16 by reversely operating the fan. The other configuration in the second embodiment is similar to that in the first embodiment, and the description will be omitted.

The action of the clean room device 15 of the second embodiment of the present invention which is constructed as described above will be described.

A specified number of fan filter units 14 perform the blow-out operation, and the residual fan filter units 14 perform the suck-in operation. Each of the numbers of the fan filter units 14 which perform the blow-out operation and the suck-in operation is determined by considering the ratio of the air volume of the air sent into the room 10 and the air volume of the air sucked into the over-ceiling space 16. For example, as described in the first embodiment, it is preferable that the total air volume of the air flowing from the interior of the room 10 to the over-ceiling space 16 becomes 5% to 15% of the total air volume of the air flowing from the over-ceiling space 16 into the room 10, when the air pressure in the room 10 is higher than the air pressure in the over-ceiling space 16 by 0.2 mmAq to 1.5 mmAq.

Thus, in the case of the clean room device 15 of the second embodiment, a specified number of fan filter units 14 perform the blow-out operation, and the residual fan filter units 14 perform the suck-in operation, and therefore, part of the air in the room 10 is sucked into the over-ceiling space 16. Thereby, the dust does not stay in the room 10, and is collected by the filter in the fan filter unit 14, and the cleanliness of the air in the room 10 can be raised.

It does not occur for the dust collected by the filter of the fan filter unit 14 to scatter again, even if the direction in which the air passes through the filter is changed. Accordingly, the operation of the fan filter unit 14 can freely be switched between the blow-out operation and the suck-in operation according to the change of the situation. Consequently, it is also possible to deal with the rearrangement of the room 10.

In the case of the above-described second embodiment, a fan filter unit 14 is provided to all grid spaces constructed by the ceiling frames 36 in the ceiling 12, but the present invention is not limited to this. For example, even in the case where the fan filter units 14 are arranged at distances, the cleanliness of the air in the room 10 can be raised by such a method where the suck-in operation is performed in part of the fan filter units 14 and the blow-out operation is performed in the other fan filter units 14.

The clean room device 15 of a third embodiment of the present invention will be described according to FIG. 4 and FIG. 5. To the members similar to those of the first embodiment described by FIG. 1 and FIG. 2, the same reference marks are given, and the description thereof will be omitted.

Figure 4:
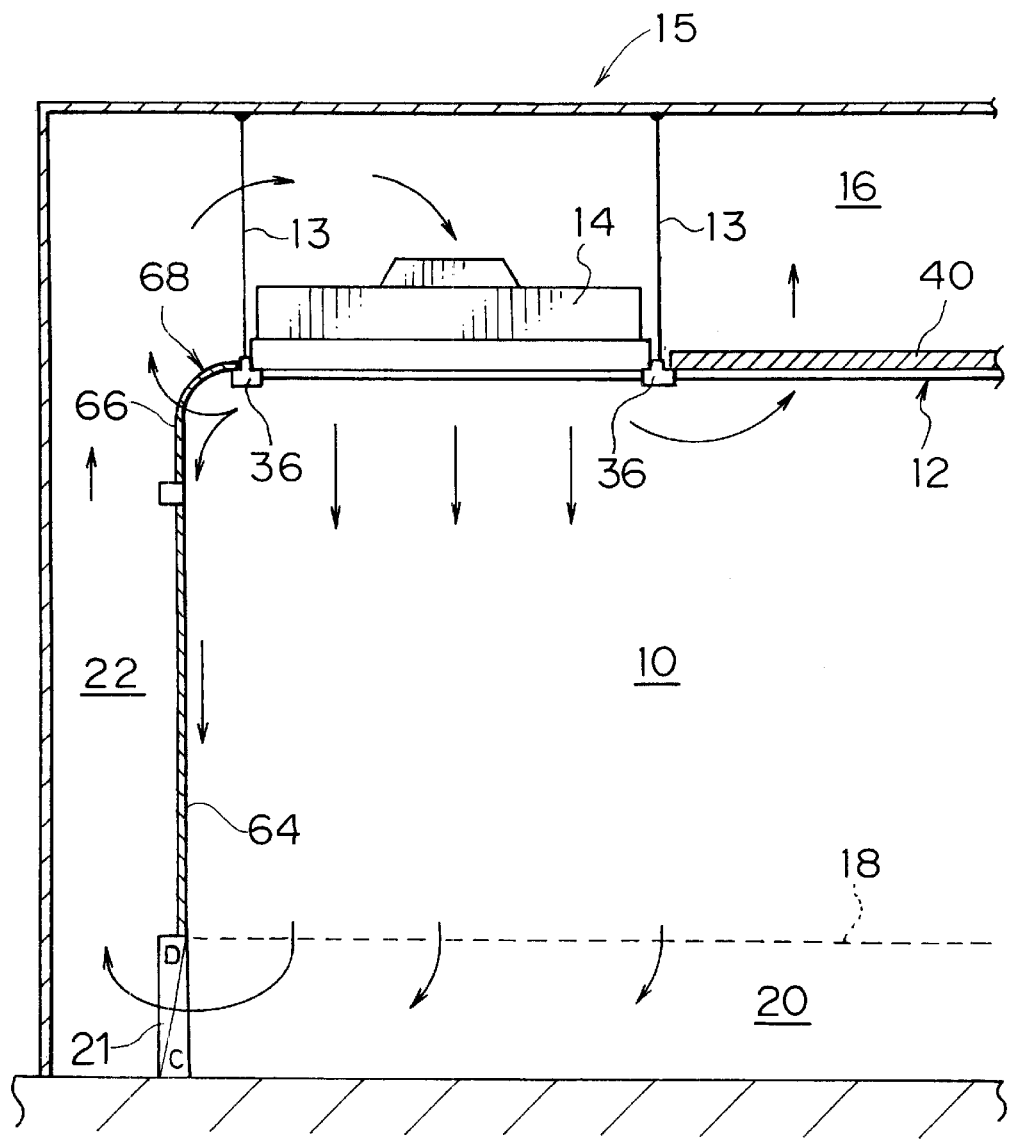
FIG. 4 is a cross sectional view showing the clean room device of a third embodiment.

As shown in FIG. 4, at a butt part 66 of the peripheral part of the ceiling 12 and a sidewall part 64 of the room 10 made of a sidewall and a pillar, a bent member 68 is provided. This bent part 68 may be provided as part of the ceiling 12 or the sidewall part 64, or it may also be provided as an independent member which connects the ceiling 12 and the sidewall part 64. The ceiling frame 36 is supported by hang bolts 13.

Figure 5:
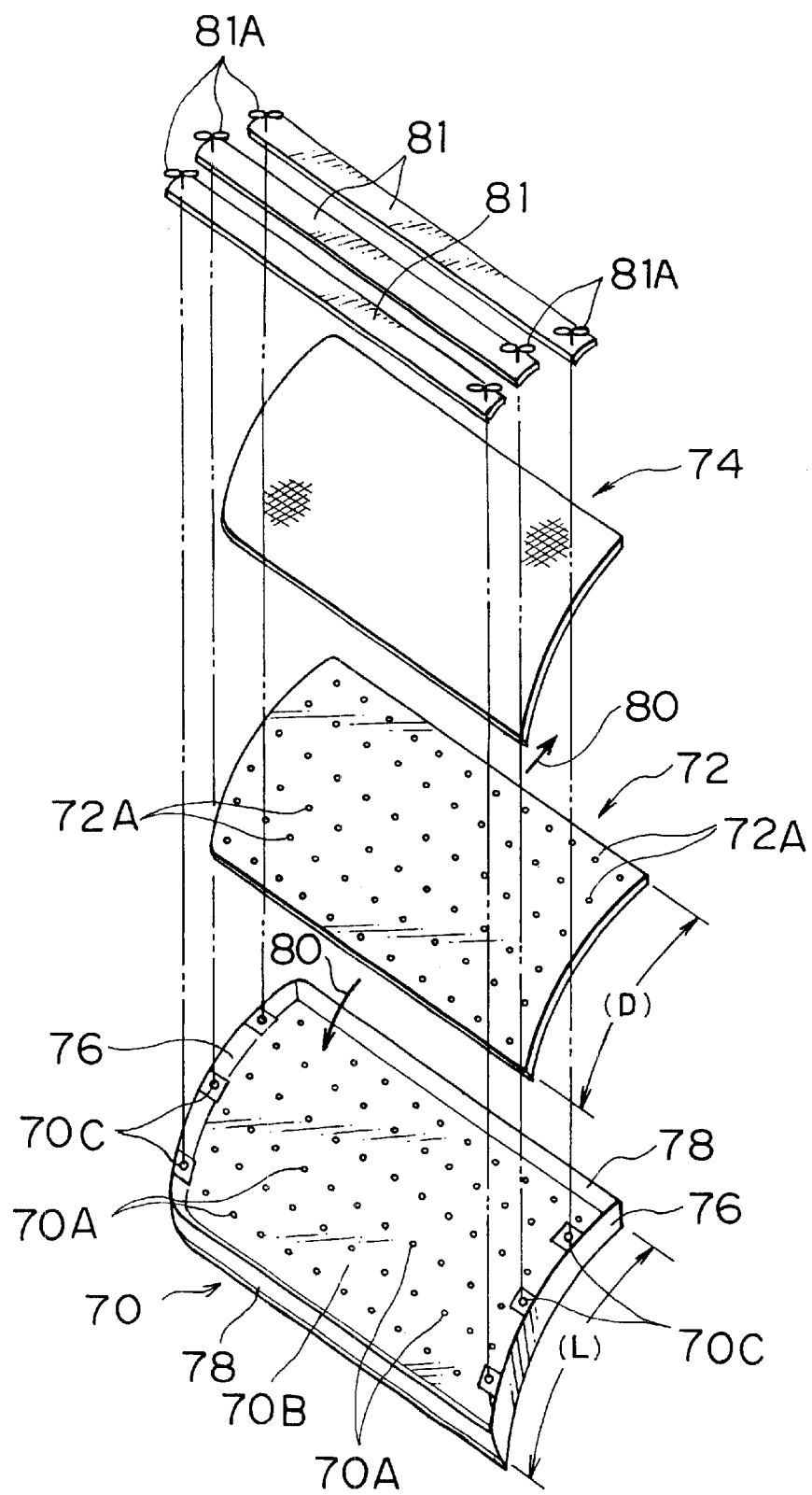
FIG. 5 is an exploded view showing a bent member in the clean room device of the third embodiment.

The bent member 68 is formed, as shown in FIG. 5, out of a bent perforated plate 70, a bent slide plate 72, and a bent filter 74. The bent perforated plate 70 faces to the room 10, and the bent filter 74 faces to the return space 22, and the bent slide plate 72 is positioned between the bent perforated plate 70 and the bent filter 74. The bent perforated plate 70 is formed out of a bottom plate 70B where a lot of holes 70A are uniformly formed, guide plates 76 formed at a pair of side edges facing to each other, and stopper plates 78 formed at the other pair of side edges facing to each other. In the bent slide plate 72, a lot of holes 72A are also formed. By sliding the bent slide plate 72 in the direction shown by the arrow 80 while making the guide plate 76 guide it, it is possible to control the overlapping condition of the holes 70A and the holes 72A, and to control the opening ratio of the bent member 68 similarly to the case of the above-described breathable body 40.

The bent filter 74 has the same structure as the filter 42 of the breathable body 40, and collects the dust in the air passing through the bent member 68, and prevents the dust from moving between the interior of the room 10 and the return space 22. The bent filter 74 is held by a plurality of bent support plates 81, and the bent support plate 81 has the tip parts fixed by set screws 81A to be screwed in holes 70C formed in the bent perforated plate 70.

The action of the clean room device 15 of the third embodiment of the present invention which is constructed as described above will be described.

By driving the fan of the fan filter unit 14, clean air is sent into the room 10. The air sent in from the fan filter unit 14 near the peripheral part of the ceiling 12 flows downward along the sidewall part 64. At the butt part 66 of the sidewall part 64 and the ceiling 12, a bent member 68 is provided, and the butt part 66 is made to have roundness, and therefore, the downward current smoothly flows along the bent shape of the bent member 68. Thereby, when compared with the structure where the butt part 66 has a sharp corner, it is difficult for the swirling current to be caused at the peripheral area of the ceiling 16, and therefore, it is possible to prevent the dust from staying at the peripheral area of the ceiling 16, and the cleanliness in the room 10 can be raised. Furthermore, the bent member 68 is made to have breathability, and therefore, the bent member 68 has the function similar to that of the above-described breathable body 40. That is, part of the air in the peripheral area of the ceiling 12 in the room 10 flows into the return space 22 through the bent member 68, and returns to the over-ceiling space 16. Thereby, it is possible to furthermore prevent the occurrence of the swirling current in the peripheral area of the ceiling 12 in the room 10, and the cleanliness in the room 10 can be raised in cooperation with the action of the breathable body 40.

EXAMPLE

An example of the clean room device of the present invention will be described below.

To the ceiling 12 in the room 10 which is shown in FIG. 2, ceiling frames 36 with 72 grid spaces were provided. Among those grid spaces, to 18 grid spaces, fan filter units 14 were provided, and to the other 54 grid spaces, that is, open grid spaces, breathable bodies 40 made of only filters 42 were provided. A fan filter unit which had a width of 0.6 m, a length of 1.2 m, and a height of 0.3 m and which could send the air of 960 $m^3/h$ was used as the fan filter unit 14. An ULPA (Ultra Low Penetration Air) filter was used as the filter in the fan filter unit 14 and the filter 42. The height of the room 10 was 3.5 m, the height of the under floor space 20 was 4 m, and the height of the over-ceiling space 16 was 3.2 m.

Next, the action of the example which was constructed as described above will be described.

Figure 6:
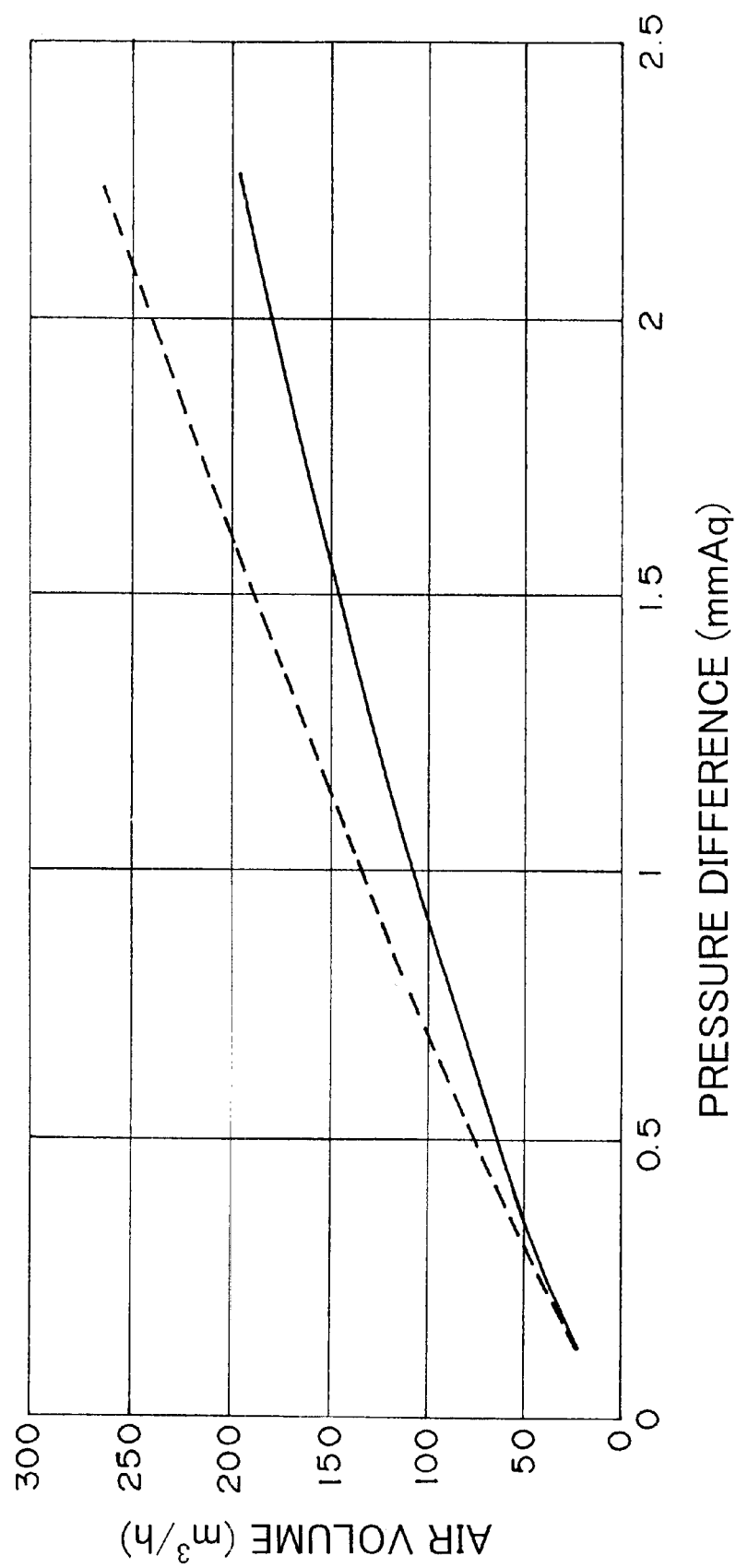
FIG. 6 is a relational drawing showing a difference between an air pressure in the room of the clean room device and an air pressure in an over-ceiling space, and showing the air volume of the air flowing through the breathable body, in an example of the present invention.

FIG. 6 is a relational drawing of the difference between the air pressure in the room 10 and the air pressure in the over-ceiling space 16, and of the air volume of the air flowing from the interior of the room 10 through the breathable body 40 to the over-ceiling space 16. In the drawing, the solid line shows the results in the case where the ULPA filter was used as described above, and the broken line shows the results of the comparison example where the PTFE filter (ultra high performance air filter using a polytetrafluoroethylene filter) was used as the filter in the fan filter unit 14 and the filter 42. Here, the air volume of the air which flows into the over-ceiling space 16 from the inside of the room 10 through one grid space is shown.

As shown in FIG. 6, the air volume of the air flowing from the inside of the room 10 through the breathable body 40 to the over-ceiling space 16 became less as the air pressure difference between the inside of the room 10 and the over-ceiling space 16 was smaller, and the air volume became more as the air pressure difference was larger. In the case of the present example, when the air pressure in the room 10 was higher than the air pressure in the over-ceiling space 16 by 0.2 mmAq to 1.5 mmAq, the inside of the room 10 was efficiently purified. That is, when the air pressure difference was too small, the air hardly flowed from the inside of the room 10 to the over-ceiling space 16, and a swirling current was caused in the room 10, and the dust stayed in the room 10. On the contrary, when the air pressure difference was too large, most of the clean air sent into the room 10 by the fan filter unit 14 flowed to the over-ceiling space 16 through the breathable body 40, and the purification in the room 10 was not efficiently performed.

When the air pressure in the room 10 was higher than the air pressure in the over-ceiling space 16 by 0.2 mmAq to 1.5 mmAq, the total of the air volume of the air flowing from the inside of the room 10 through all filters 42 to the over-ceiling space 16 was 5 to 15% of the total of the air volume of the air sent into the room 10 from the over-ceiling space 16 by all fan filter units 14. Furthermore, as understood from FIG. 6, it was possible to easily control the air volume of the air flowing from the inside of the room 10 through the filter 42 to the over-ceiling space 16 by changing the kind of the filter 42.

In the case of the present example, the action at the time when the air pressure in the room 10 is higher than the air pressure in the over-ceiling space 16 by 0.25 mmAq will be described below.

Figure 7:
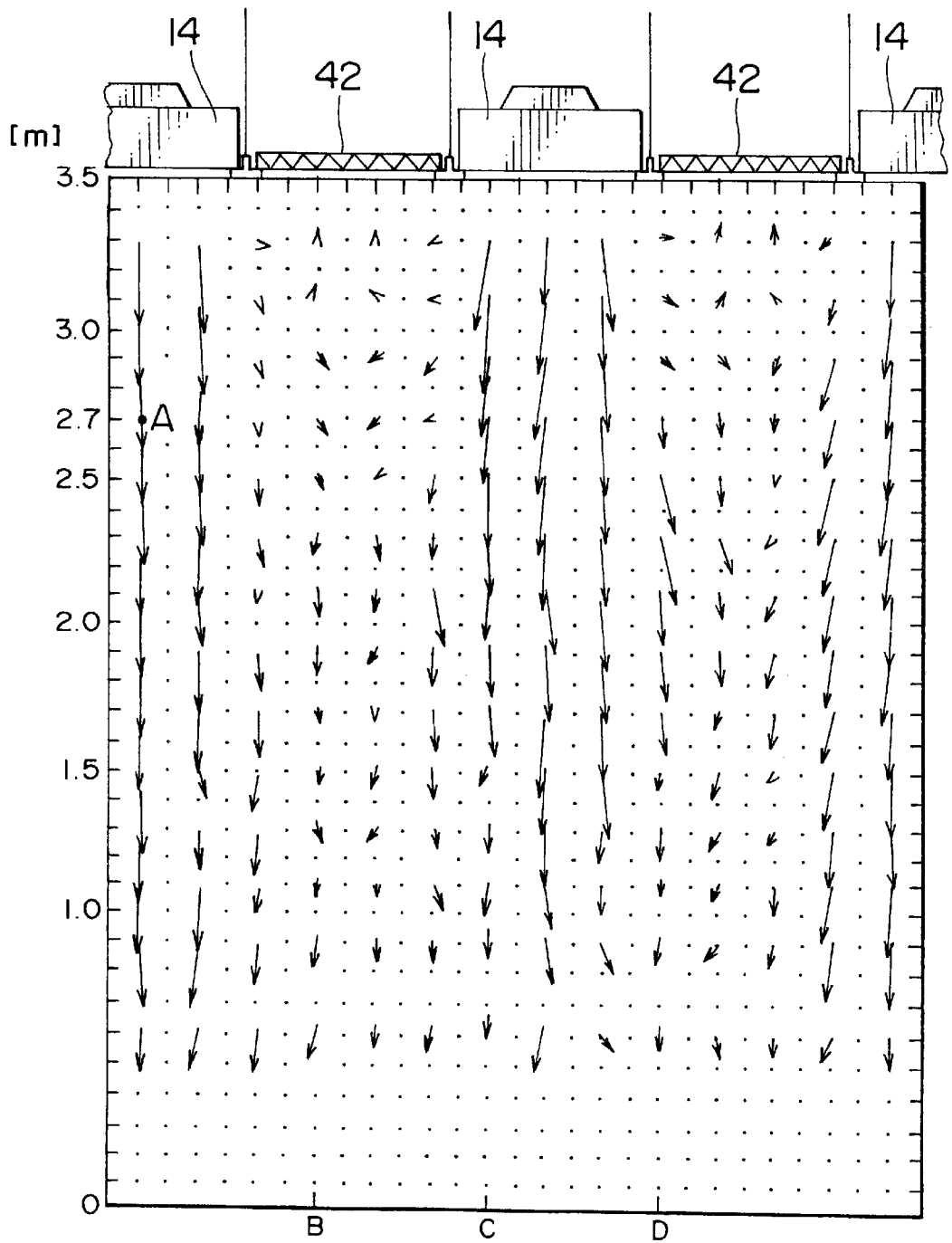
FIG. 7 is a drawing showing a model of a current in the room of the clean room device of the example of the present invention.

FIG. 7 is a drawing of the model showing the result of the measurement of the current of the air in the room 10 of the clean room device 15. In the above-described drawing, the direction of the arrow shows the flowing direction of the air, and the size of the arrow shows the current velocity of the air. As shown in the above-described drawing, under the fan filter unit 14, a strong downward current was caused. The dust in the air in this area was removed to the outside of the room 10 through the grating floor 18. On the other hand, right under the breathable body 40, an upward current was caused. Part of the air sent into the room 10 by the fan filter unit 14 flowed into the over-ceiling space 16 through the breathable body 40, and the dust in that air was collected by the filter 42. Thus, since the breathable body 40 was provided in the open grid space where no fan filter unit 14 was provided, the dust in the air in the room 10 was removed without staying in the room 10.

FIG. 8 is a drawing showing the result which was obtained in such a way where the dust was artificially produced at the point A in FIG. 7 and the dust density (number of parts of the dust per cubic foot) was measured at the measuring positions B, C and D in the room 10. The horizontal distances from the point A to the measuring positions B, C and b were 0.6 m, 1.2 m, and 1.8 m, respectively, and at each of the measuring positions B, C and D, the measurement was performed at each of the points whose heights from the grating floor 18 were 2.7 m, 2.4 m, 2.1 m, 1.8 m, and 1.5 m. The measurement result by the present example is shown by circular marks, and the measurement result by the comparison example where a closing plate was provided instead of the filter 42 in the open grid space is shown by cross marks.

As shown in the above-described drawing, at almost all measuring positions, the dust density in the air in the room 10 in the case of the present example where a filter 42 was provided at the open grid space was half or less of that of the comparison example where a closing plate was provided. Thus, since a breathable body 40 was provided at the open grid space where the fan filter unit 14 was not provided, the cleanliness in the room 10 could be raised.

INDUSTRIAL APPLICABILITY

As mentioned above, according to the clean room device of the present invention, in the ceiling of the room, the fan filter units are arranged at distances, and at the open grid space where no fan filter unit is provided, a breathable body is provided, so that part of the air in the room flows to the over-ceiling space through the breathable body. Thereby, even if the fan filter units are arranged at distances, it is possible to prevent the occurrence of the swirling current in the area under the open grid space in the room, and therefore, it is possible to prevent the dust from staying in the room, and the cleanliness in the room can be raised.

What is claimed is:

1. A clean room device, comprising:

a room with a ceiling;

a fan filter unit which is provided to said ceiling to send clean air into said room from an over-ceiling space; and a filter which is provided to said ceiling, wherein a part of air in said room flows to said over-ceiling space through said filter because of a difference between air pressure in said room and air pressure in said over-ceiling space.

2. The clean room device according to claim 1, wherein said filter includes a perforated plate which controls an air flow rate of said filter.

3. The clean room device according to claim 1, further comprising:

a fan which is provided over said filter, wherein at least one of a blow-out operation where said fan is operated to send air into said room through said filter from said over-ceiling space, and a suck-in operation where said fan is reversely operated to suck part of the air in said room into said over-ceiling space through said filter is performed.

4. The clean room device according to claim 1, wherein said filter has such a breathability that when air pressure in said room is higher than air pressure in said over-ceiling space by 0.2 mmAq to 1.5 mmAq, a total air volume of the air which flows into said over-ceiling space through said filter from an interior of said room becomes 5% to 15% of a total air volume of the air which is sent into said room from said over-ceiling space by said fan filter unit.

5. The clean room device according to claim 1, wherein said fan filter units and said filters are provided to a plurality of grid spaces which are formed by ceiling frames provided to said ceiling, separately and respectively.

6. The clean room device according to claim 2, further comprising:

a fan which is provided over said filter, wherein at least one of a blow-out operation where said fan is operated to send air into said room through said filter from said over-ceiling space, and a suck-in operation where said fan is reversely operated to suck part of the air in said room into said over-ceiling space through said filter is performed.

7. The clean room device according to claim 2, wherein said filter has such a breathability that when air pressure in said room is higher than air pressure in said over-ceiling space by 0.2 mmAq to 1.5 mmAq, a total air volume of the air which flows into said over-ceiling space through said filter from an interior of said room becomes 5% to 15% of a total air volume of the air which is sent into said room from said over-ceiling space by said fan filter unit.

8. The clean room device according to claim 2, wherein said fan filter units and said filters are provided to a plurality of grid spaces which are formed by ceiling frames provided to said ceiling, separately and respectively.

* * * * *